United States Patent [19]

Dumant et al.

[11] Patent Number: 4,762,396

[45] Date of Patent: Aug. 9, 1988

[54] MASKING METHOD

[76] Inventors: Jean M. Dumant, 8 Rue de la Torsade Crolles, Brignoux 38190; Bruno Latombe, 6 Rue Desnos, Saint Martin D'Heres 38400, both of France

[21] Appl. No.: 932,599

[22] Filed: Nov. 20, 1986

[30] Foreign Application Priority Data

Nov. 21, 1985 [FR] France ................... 85 17487

[51] Int. Cl.⁴ ............................................. G02B 5/00
[52] U.S. Cl. .................................... 350/320; 350/318; 430/5
[58] Field of Search .............. 350/320, 321, 311, 318, 350/319, 164, 166, 438; 250/370 R, 370 E, 371, 515.1; 354/1; 430/4, 5, 6

[56] References Cited

U.S. PATENT DOCUMENTS 4,514,489  4/1985  Garcia et al. ................... 430/5
4,555,460 11/1985  Harms et al. .................. 350/318

FOREIGN PATENT DOCUMENTS 60-135949 7/1985 Japan .

Primary Examiner—John K. Corbin
Assistant Examiner—Loha Ben
Attorney, Agent, or Firm—Lowe, Price, LeBlanc, Becker & Shur

[57] ABSTRACT

A masking method for controlling the limit of irradiation areas of a photoresist material layer by an irradiation source having a given wavelength, through a mask designed for forming on the photoresist material layer a given image, by means of an optical system having a given resolution limit, comprising the step of forming at the limit between dark and transparent areas of the mask, dark stripes having a chosen width (a) and spaced apart from the limit by a chosen distance (b), the width (a) and the distance (b) being such that the product of their values by the reduction factor of the optical system is lower than the resolution limit.

2 Claims, 2 Drawing Sheets

MASKING METHOD

TECHNICAL FIELD

The invention relates to a masking method and to a mask used for implementing this method. It relates more specifically to masks of the type used for manufacturing discrete or integrated semiconductor components wherein very thin patterns are formed, for example, patterns having sizes in the range of a portion of micrometer to several micrometers.

BACKGROUND OF THE INVENTION

In the manufacturing of integrated circuits, photo-etching is used for reproducing the image of a pattern drawn on a mask. This image is formed on a thin layer of photoresist itself deposited onto a layer of a product to be specifically etched, for example a silicon dioxide layer. After having been exposed, irradiated areas of the resist are dissolved by a suitable developing material, in case of a positive photoresist. Conversely, the non-irradiated areas are dissolved in case of a negative resist. In the present application, only the case of a positive photoresist material shall be explained, but it is clear that it applies conversely to the case of a negative photoresist material.

FIG. 1 illustrates a basic projection masking method. The image of a mask 1 is formed through an optical system 2 on an area 3 of a wafer 4. The mask may correspond to the whole wafer or comprise the drawing of an elementary integrated circuit which is repeated a plurality of times on the wafer by moving same at successive positions. The mask 1 is usually at a scale ranging between 1 and 10 with respect to the image to be obtained on the wafer.

An example of an operation made on a wafer is illustrated in FIG. 2. The image of a mask comprising a dark layer with a slot-shaped aperture is projected onto a wafer comprising for example a silicon substrate 10 coated with a silicon dioxide layer 11 ($SiO_2$), itself coated with a photoresist material layer 12. The photoresist layer is illuminated at the image of the slot and, further exposed to etching by a selected material, so that the irradiated area is eliminated for obtaining in the photoresist an aperture 13. The slope of the edges of this aperture is, in a large proportion, determined by the characteristics of the exposure system and mainly by the aperture number of the projection system.

After etching the photoresist layer, it is possible to form an aperture 14 into the underlying silicon dioxide layer, for example by plasma etching. In case of an anisotropic plasma etching, the slope of the edges of the aperture 14 in the layer 11 will depend upon the slope of the edges of the aperture 13 in the photoresist layer 12. It is known that if B2 is the slope of the edges of the aperture 14 and B1 the slope of the edges of the aperture 13, $\tan B2 = (V2/V1) \tan B1$, V2 and V1 being the respective etching rates in the plasma of the photoresist material and the silicon dioxide (or any other material forming the layer 11). Therefore, by controlling the slope of the apertures formed in the photoresist material, it will be possible to control the slope of the apertures formed in the underlying layer. The latter slope presents an important practical interest. Indeed, in the above example, if the aperture 14 corresponds to a metallization contact and a connection by means of, for example, an aluminum metallization is to be made, if the edges of aperture 14 are too stiff, the aluminum layer is liable to crack or not to cover the upper corners of aperture 14 in the silicon dioxide layer 11. This risk is reduced if the aperture is flared out.

The control of the slopes presents another important practical consideration. The automatic alignment of exposition machines very often uses the contrast of a mark etched into the wafer at a former masking level. Such systems are generally sensitive to the thickness of the underlying layers. If the edges of those marks are flaring too much, this sensitivity is reduced due to the diffraction increase.

In case the apertures to be formed are greater than several micrometers, a plurality of methods exist for softening the slope of the apertures formed in the photoresist material. For example, curing after developing is possible, which causes the photoresist material to flow and rounds up the upper angles of the apertures. On the contrary, when the technology used causes the minimum dimensions of some patterns to be in the range of one micrometer, the thickness of the photoresist layer is in the same range as the width that has to be maintained. In this case, the flowing technics are no longer suitable because some effects associated with surface stresses are caused and, for example, a rib of one micrometer width of photoresist material, instead flowing over the underlying layer will possibly concentrate to attain an ovoid shape.

In the absence of techniques such as curing, the slope of the aperture in the pattern is determined by the characteristics of the exposure optical system and in fact mainly by the aperture number of this optical system. In case of patterns having sizes equal to or lower than one micrometer, one chooses systems with a large aperture number, for example in the range of 0.35 and its results therefrom that the slopes of the edges of the apertures formed in the photoresist material are naturally in the range of 80° or more.

SUMMARY OF THE INVENTION

Therefore, it is an object of the invention to provide for a new method for obtaining a desired slope in an aperture formed in a photoresist material.

For attaining this object, the invention provides for a masking method for controlling the limits of the irradiation areas of a photoresist material layer by an irradiation source having a given wavelength, through a mask designed for forming on the photoresist material layer a given image, by means of an optical system having a given resolution limit, comprising the step of forming at the limit between dark and transparent areas of the mask dark stripes having a chosen width (a) and spaced apart from the border by a chosen distance (b), said width (a) and said distance (b) being such that their values multiplied by the reduction factor of the optical system is lower than the resolution limit thereof.

This method permits controlling the slope and, more specifically, provides a suitable choice of the size of the stripes added on the edges of the mask pattern, slopes in the range of 65° which are generally suitable for providing in a subsequent step apertures with a suitable slope in an underlying layer.

BRIEF DESCRIPTION OF THE DRAWINGS

Those objects, features and advantages and others of the invention shall be explained in greater detail in the following description of a preferred embodiment in connection with the attached dawings wherein:

FIGS. 3A to 8A show mask patterns; and

FIGS. 3B to 8B show the patterns obtained on a photosensitive layer after development, by using masks as shown in FIGS. 3A to 8A.

FIGS. 3B to 8B show the shape obtained by using masks as shown in FIGS. 3A to 8A in case one uses an optical system having an aperture number equal to 0.35, the thickness of the photoresist material layer being slightly over one micrometer, the wavelength of the radiation being 0.436 micrometer and the resolution limit of the optical system being substantially equal to 0.8 micrometer.

DESCRIPTION OF THE DRAWINGS

Figure 1:
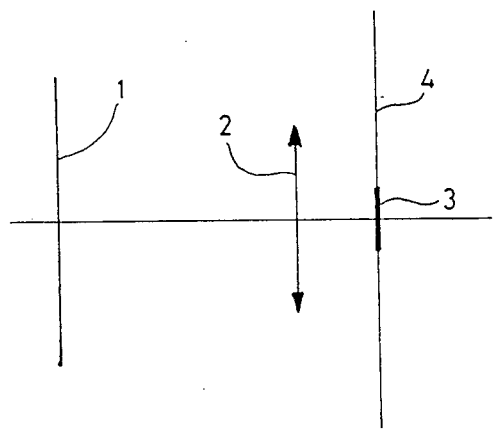
FIG. 1 schematically shows a classical projection photoetching system.
Figure 2:
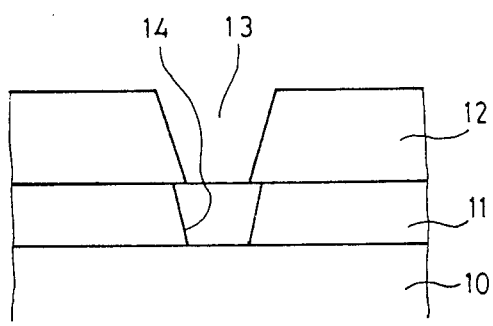
FIG. 2 shows the formation of successive apertures in successive layers formed on a substrate.
Figure 3A:
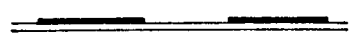
Figure 3B:
Figure 5A:
Figure 5B:
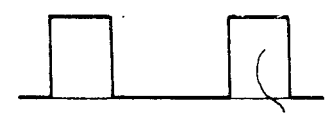

FIG. 3A shows a 1 to 1 mask generally dark with a slot-shaped aperture having a width of 1.5 micrometer. Thus, after developing in a positive photoresist material, an aperture is obtained with edges having a slope of about 80° as shown in FIG. 3B. FIG. 5A shows a case of a mask comprising two dark stripes having a 1 micrometer width and about 2 micrometers from one another. The resulting image is shown in FIG. 5B: two photoresist ribs the edges of which have a slope of about 80°.

In case the limits between the dark and the transparent areas of the mask are delimited by dark stripes having a width "a" and separated by a distance "b" with respect to said limit, one obtains results as shown in FIGS. 4B and 6B to 8B.

Figure 4A:
Figure 4B:
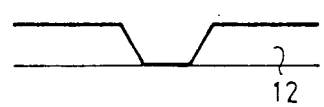
Figure 6A:
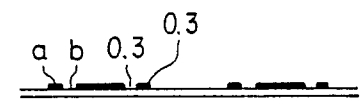
Figure 6B:
Figure 7A:
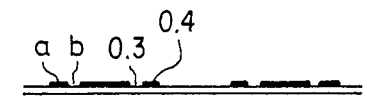
Figure 7B:
Figure 8A:
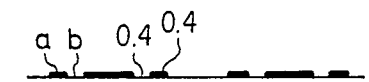
Figure 8B:

In FIG. 4A, a=0.3 and b=0.4 micrometer on both sides of an aperture in a mask. Thus, a slope is obtained with edges having a slope of about 65°. An identical slope is obtained in case of adjacent ribs if a=0.4 and b=0.3 micrometer (FIGS. 7A and 7B). Different slopes are obtained as shown in FIG. 6B when a=b=0.3 micrometer (FIG. 6A) and in FIG. 8B when a=b=0.4 micrometer (FIG. 8A).

Therefore, by choosing the values of a and b it is possible to modify in an important range the edge slope of the patterns formed in the photoresist material after developing.

Another parameter to be considered is that the slopes vary with the lighting intensity in some cases. One can see experimentally that, for given choice of a and b, the sensitivity to the lighting dose decreases, that is, substantially the same results are obtained for a given pattern whatever be the lighting. This is the case for example of the structure of FIGS. 4A-4B.

In the above, for the sake of simplicity, the values of a and b have been indicated while assuming that the mask was at the same scale as the pattern to be obtained. Of course, in case of a mask to a widened scale, and of a reducing optical system, the values of a and b have to be multiplied by the reduction factor R of the optical system. For example, when R=10 the above indicated values of a and b have to be multiplied by 10. Such sizes are easily implementable on a mask with classical means. However, even in the case of a 1/1 mask, it is possible, by using suitable methods, for example by using electronic beams, to obtain on the mask very thin patterns by yielding the stripes according to the invention.

Experiments made by the inventors have shown that it was possible, in normal conditions of etching and lighting, to obtain a given slope B for the edges of an aperture in a photoresist layer by choosing the values a and b above defined substantially in accordance with the following formula:

$$B = \text{Arc tan}\,(a/b)[e.R/(a+b)] \quad (1)$$

where:
e is the thickness of the photoresist material layer,
R is the reduction factor of the projection optical system.

For example, in a case where a and b are comprised between 2 and $5 \times 10^{-6}$ m, $e = 1.2 \times 10^{-6}$ m, $R=10$, the following values have been obtained:

| b ($10^{-6}$ m) | a ($10^{-6}$ m) | B calculated (degrees) | B measured (degrees) |
| --- | --- | --- | --- |
| / | 0 | 90 | 82 |
| 2 | 4 | 76 | 75 |
| 3 | 3 | 63 | 67 |
| 3 | 4 | 66 | 65 |
| 4 | 4 | 56 | 55 |

In the above table, the first line corresponds to the case where the invention is not used. It is seen that there is a large difference between the calculated and measured results. This is normal in this limit case. In the other cases, the measured value is in good agreement with the calculated values.

The transformation of a classical mask to a mask the limits of which are provided with dark stripes according to the invention is made by automatic conversion in the data files once the designer has terminated the circuit drawing. It is a simple operation analogous to the one classicaly implemented for checking and coding a mask.

The invention can be subjected to various modifications that shall appear to those skilled in the art. For example, instead of a single lateral stripe on each side of a mask pattern, it will be possible to provide for a plurality of lateral stripes.

We claim:

1. A masking method for controlling limits of irradiated regions of a photoresist material layer, said layer being formed on a substrate, wherein the image of a mask is formed on said layer by means of an optical system having a predetermined reduction factor, said masking method comprising the steps of:

selecting a mask having a desired pattern of dark and transparent areas;

adding to the transparent areas of the mask, at a distance (b) from the borders of said dark and transparent areas, narrow dark stripes having a width (a);

said width (a) and said distance (b) being such that the product of their values by the reduction factor of the optical system is lower than a resolution limit thereof.

2. The method of claim 1, wherein said distance (b) and said width (a) are chosen for obtaining a selected slope (B) of the edges of an aperture in said photoresist material layer substantially according to the following formula:

$$B = \text{Arc tan}\,(a/b)[(e.R/(a+b)]$$

where:
e is the thickness of the photoresist material layer,
R is the reduction factor of the projection optical system.

* * * * *